(12) United States Patent
Campbell et al.

(10) Patent No.: US 9,032,818 B2
(45) Date of Patent: May 19, 2015

(54) MICROELECTROMECHANICAL LOAD SENSOR AND METHODS OF MANUFACTURING THE SAME

(71) Applicant: NextInput, Inc., Atlanta, GA (US)

(72) Inventors: Ian Campbell, Smyma, GA (US); Ryan Diestelhorst, Atlanta, GA (US)

(73) Assignee: NextInput, Inc., Atlanta, GA (US)

( * ) Notice: Subject to any disclaimer, the term of this patent is extended or adjusted under 35 U.S.C. 154(b) by 0 days.

(21) Appl. No.: 13/934,900

(22) Filed: Jul. 3, 2013

(65) Prior Publication Data

US 2014/0007705 A1     Jan. 9, 2014

Related U.S. Application Data

(60) Provisional application No. 61/668,135, filed on Jul. 5, 2012.

(51) Int. Cl.

| | |
|---|---|
| *G01L 1/22* | (2006.01) |
| *G01L 1/18* | (2006.01) |
| *B81B 3/00* | (2006.01) |

(Continued)

(52) U.S. Cl.
CPC .............. *G01L 1/18* (2013.01); *B81B 3/0018* (2013.01); *B81C 1/00134* (2013.01); *G01L 1/148* (2013.01); *G01L 1/26* (2013.01); *G01L 5/162* (2013.01)

(58) Field of Classification Search
USPC .................................................. 73/862.628
See application file for complete search history.

(56) References Cited

U.S. PATENT DOCUMENTS

| | | | |
|---|---|---|---|
| 4,914,624 | A | 4/1990 | Dunthorn |
| 4,918,262 | A | 4/1990 | Flowers et al. |

(Continued)

FOREIGN PATENT DOCUMENTS

| | | |
|---|---|---|
| JP | 2004/156937 | 6/2004 |
| WO | 2007/139695 | 12/2007 |

OTHER PUBLICATIONS

Mei, Tao, et al., "Design and Fabrication of an Integrated Three-Dimensional Tactile Sensor for Space Robotic Applications," Micro Electro Mechanical Systems, Twelfth IEEE International Conference, Jan. 17-21, 1999, pp. 112-117.

(Continued)

*Primary Examiner* — Lisa Caputo
*Assistant Examiner* — Octavia D. Hollington
(74) *Attorney, Agent, or Firm* — Meunier Carlin & Curfman, LLC (57) ABSTRACT

A microelectromechanical ("MEMS") load sensor device for measuring a force applied by a human user is described herein. In one aspect, the load sensor device has a contact surface in communication with a touch surface which communicates forces originating on the touch surface to a deformable membrane, on which load sensor elements are arranged, such that the load sensor device produces a signal proportional to forces imparted by a human user along the touch surface. In another aspect, the load sensor device has an overload protection ring to protect the load sensor device from excessive forces. In another aspect, the load sensor device has embedded logic circuitry to allow a microcontroller to individually address load sensor devices organized into an array. In another aspect, the load sensor device has electrical and mechanical connectors such as solder bumps designed to minimize cost of final component manufacturing.

20 Claims, 8 Drawing Sheets

(51) Int. Cl.
  *B81C 1/00* (2006.01)
  *G01L 1/14* (2006.01)
  *G01L 1/26* (2006.01)
  *G01L 5/16* (2006.01)

(56) References Cited

U.S. PATENT DOCUMENTS

| | | | |
|---|---|---|---|
| 4,933,660 A | 6/1990 | Wynne | |
| 4,983,786 A | 1/1991 | Stevens et al. | |
| 5,159,159 A | 10/1992 | Asher | |
| 5,237,879 A | 8/1993 | Speeter | |
| 5,320,705 A | 6/1994 | Fujii et al. | |
| 5,333,505 A | 8/1994 | Takahashi et al. | |
| 5,343,220 A | 8/1994 | Veasy et al. | |
| 5,349,746 A | 9/1994 | Gruenwald et al. | |
| 5,351,550 A | 10/1994 | Maurer | |
| 5,483,994 A | 1/1996 | Maurer | |
| 5,510,812 A | 4/1996 | O'Mara et al. | |
| 5,541,372 A | 7/1996 | Baller et al. | |
| 5,543,591 A | 8/1996 | Gillespie et al. | |
| 5,565,657 A | 10/1996 | Merz | |
| 5,600,074 A | 2/1997 | Marek et al. | |
| 5,673,066 A | 9/1997 | Toda et al. | |
| 5,889,236 A | 3/1999 | Gillespie et al. | |
| 5,921,896 A | 7/1999 | Boland | |
| 6,028,271 A | 2/2000 | Gillespie et al. | |
| 6,159,166 A | 12/2000 | Chesney et al. | |
| 6,243,075 B1 | 6/2001 | Fishkin et al. | |
| 6,348,663 B1 | 2/2002 | Schoos et al. | |
| 6,351,205 B1 | 2/2002 | Armstrong | |
| 6,360,598 B1 | 3/2002 | Calame et al. | |
| 6,437,682 B1 | 8/2002 | Vance | |
| 6,555,235 B1 | 4/2003 | Aufderheide et al. | |
| 6,556,189 B1 | 4/2003 | Takahata et al. | |
| 6,569,108 B2 | 5/2003 | Sarvazyan et al. | |
| 6,610,936 B2 | 8/2003 | Gillespie et al. | |
| 6,620,115 B2 | 9/2003 | Sarvazyan et al. | |
| 6,629,343 B1 | 10/2003 | Chesney et al. | |
| 6,668,230 B2 | 12/2003 | Mansky et al. | |
| 6,720,712 B2 | 4/2004 | Scott et al. | |
| 6,788,297 B2 | 9/2004 | Itoh et al. | |
| 6,801,191 B2 | 10/2004 | Mukai et al. | |
| 6,809,280 B2 | 10/2004 | Divigalpitiya et al. | |
| 6,812,621 B2 | 11/2004 | Scott | |
| 6,822,640 B2 | 11/2004 | Derocher | |
| 6,879,318 B1 | 4/2005 | Chan et al. | |
| 6,888,537 B2 | 5/2005 | Benson et al. | |
| 6,931,938 B2 | 8/2005 | Knirck et al. | |
| 6,995,752 B2 | 2/2006 | Lu | |
| 7,138,984 B1 | 11/2006 | Miles | |
| 7,173,607 B2 | 2/2007 | Matsumoto et al. | |
| 7,190,350 B2 | 3/2007 | Roberts | |
| 7,215,329 B2 | 5/2007 | Yoshikawa et al. | |
| 7,218,313 B2 | 5/2007 | Marcus et al. | |
| 7,224,257 B2 | 5/2007 | Morikawa | |
| 7,245,293 B2 | 7/2007 | Hoshino et al. | |
| 7,273,979 B2 | 9/2007 | Christensen | |
| 7,280,097 B2 | 10/2007 | Chen et al. | |
| 7,324,094 B2 | 1/2008 | Moilanen et al. | |
| 7,324,095 B2 | 1/2008 | Sharma | |
| 7,336,260 B2 | 2/2008 | Martin et al. | |
| 7,337,085 B2 | 2/2008 | Soss | |
| 7,345,680 B2 | 3/2008 | David | |
| 7,406,661 B2 | 7/2008 | Väänänen et al. | |
| 7,425,749 B2 | 9/2008 | Hartzell et al. | |
| 7,426,873 B1 | 9/2008 | Kholwadwala et al. | |
| 7,449,758 B2 | 11/2008 | Axelrod et al. | |
| 7,460,109 B2 | 12/2008 | Safai et al. | |
| 7,476,952 B2 | 1/2009 | Vaganov et al. | |
| 7,508,040 B2 | 3/2009 | Nikkel et al. | |
| 7,554,167 B2 | 6/2009 | Vaganov | |
| 7,607,111 B2 | 10/2009 | Vaananen et al. | |
| 7,620,521 B2 | 11/2009 | Breed et al. | |
| 7,629,969 B2 | 12/2009 | Kent | |
| 7,649,522 B2 | 1/2010 | Chen et al. | |
| 7,663,612 B2 | 2/2010 | Bladt | |
| 7,685,538 B2 | 3/2010 | Fleck et al. | |
| 7,698,084 B2 | 4/2010 | Soss | |
| 7,701,445 B2 | 4/2010 | Inokawa et al. | |
| 7,746,327 B2 | 6/2010 | Miyakoshi | |
| 7,791,151 B2 * | 9/2010 | Vaganov et al. | 257/417 |
| 7,819,998 B2 | 10/2010 | David | |
| 7,825,911 B2 | 11/2010 | Sano et al. | |
| 7,903,090 B2 | 3/2011 | Soss et al. | |
| 7,921,725 B2 | 4/2011 | Silverbrook et al. | |
| 7,952,566 B2 | 5/2011 | Poupyrev et al. | |
| 7,973,772 B2 | 7/2011 | Gettemy et al. | |
| 7,973,778 B2 | 7/2011 | Chen | |
| 8,004,052 B2 * | 8/2011 | Vaganov | 257/415 |
| 8,004,501 B2 | 8/2011 | Harrison | |
| 8,013,843 B2 | 9/2011 | Pryor | |
| 8,026,906 B2 | 9/2011 | Mölne et al. | |
| 8,044,929 B2 | 10/2011 | Baldo et al. | |
| 8,068,100 B2 | 11/2011 | Pryor | |
| 8,072,437 B2 | 12/2011 | Miller et al. | |
| 8,072,440 B2 | 12/2011 | Pryor | |
| 8,113,065 B2 | 2/2012 | Ohsato et al. | |
| 8,120,586 B2 | 2/2012 | Hsu et al. | |
| 8,120,588 B2 | 2/2012 | Klinghult | |
| 8,130,207 B2 | 3/2012 | Nurmi et al. | |
| 8,134,535 B2 | 3/2012 | Choi et al. | |
| 8,139,038 B2 | 3/2012 | Chueh et al. | |
| 8,144,133 B2 | 3/2012 | Wang et al. | |
| 8,149,211 B2 | 4/2012 | Hayakawa et al. | |
| 8,154,528 B2 | 4/2012 | Chen et al. | |
| 8,159,473 B2 | 4/2012 | Cheng et al. | |
| 8,164,573 B2 | 4/2012 | Dacosta et al. | |
| 8,183,077 B2 | 5/2012 | Vaganov et al. | |
| 8,184,093 B2 | 5/2012 | Tsuiki | |
| 8,188,985 B2 | 5/2012 | Hillis et al. | |
| 8,199,116 B2 | 6/2012 | Jeon et al. | |
| 8,212,790 B2 | 7/2012 | Rimas-Ribikauskas et al. | |
| 8,237,537 B2 | 8/2012 | Kurtz et al. | |
| 8,243,035 B2 | 8/2012 | Abe et al. | |
| 8,253,699 B2 | 8/2012 | Son | |
| 8,260,337 B2 | 9/2012 | Periyalwar et al. | |
| 8,269,731 B2 | 9/2012 | Mölne | |
| 8,289,288 B2 | 10/2012 | Whytock et al. | |
| 8,289,290 B2 | 10/2012 | Klinghult | |
| 8,319,739 B2 | 11/2012 | Chu et al. | |
| 8,325,143 B2 | 12/2012 | Destura et al. | |
| 8,350,345 B2 * | 1/2013 | Vaganov | 257/415 |
| 8,363,020 B2 | 1/2013 | Li et al. | |
| 8,363,022 B2 | 1/2013 | Tho et al. | |
| 8,378,798 B2 | 2/2013 | Bells et al. | |
| 8,378,991 B2 | 2/2013 | Jeon et al. | |
| 8,384,677 B2 | 2/2013 | Mak-Fan et al. | |
| 8,387,464 B2 * | 3/2013 | Mcneil et al. | 73/718 |
| 8,405,631 B2 | 3/2013 | Chu et al. | |
| 8,405,632 B2 | 3/2013 | Chu et al. | |
| 8,421,609 B2 | 4/2013 | Kim et al. | |
| 8,427,441 B2 | 4/2013 | Paleczny et al. | |
| 8,436,806 B2 | 5/2013 | Almalki et al. | |
| 8,436,827 B1 | 5/2013 | Zhai et al. | |
| 8,451,245 B2 | 5/2013 | Heubel et al. | |
| 8,456,440 B2 | 6/2013 | Abe et al. | |
| 8,466,889 B2 | 6/2013 | Tong et al. | |
| 8,477,115 B2 | 7/2013 | Rekimoto | |
| 8,493,189 B2 | 7/2013 | Suzuki | |
| 2003/0067448 A1 | 4/2003 | Park | |
| 2003/0189552 A1 | 10/2003 | Chuang et al. | |
| 2004/0012572 A1 | 1/2004 | Sowden et al. | |
| 2004/0140966 A1 | 7/2004 | Marggraff et al. | |
| 2005/0190152 A1 | 9/2005 | Vaganov | |
| 2006/0028441 A1 | 2/2006 | Armstrong | |
| 2006/0244733 A1 | 11/2006 | Geaghan | |
| 2006/0284856 A1 | 12/2006 | Soss | |
| 2007/0035525 A1 | 2/2007 | Yeh et al. | |
| 2007/0046649 A1 | 3/2007 | Reiner | |
| 2007/0070046 A1 | 3/2007 | Sheynblat et al. | |
| 2007/0070053 A1 | 3/2007 | Lapstun et al. | |
| 2007/0097095 A1 | 5/2007 | Kim et al. | |
| 2007/0103449 A1 | 5/2007 | Laitinen et al. | |
| 2007/0103452 A1 | 5/2007 | Wakai et al. | |

(56) References Cited

U.S. PATENT DOCUMENTS

| | | |
|---|---|---|
| 2007/0115265 A1 | 5/2007 | Rainisto |
| 2007/0132717 A1 | 6/2007 | Wang et al. |
| 2007/0137901 A1 | 6/2007 | Chen |
| 2007/0139391 A1 | 6/2007 | Bischoff |
| 2007/0152959 A1 | 7/2007 | Peters |
| 2007/0156723 A1 | 7/2007 | Vaananen |
| 2007/0182864 A1 | 8/2007 | Stoneham et al. |
| 2007/0229478 A1 | 10/2007 | Rosenberg et al. |
| 2007/0235231 A1 | 10/2007 | Loomis et al. |
| 2007/0262965 A1 | 11/2007 | Hirai et al. |
| 2007/0298883 A1 | 12/2007 | Feldman et al. |
| 2008/0001923 A1 | 1/2008 | Hall et al. |
| 2008/0007532 A1 | 1/2008 | Chen |
| 2008/0010616 A1 | 1/2008 | Algreatly |
| 2008/0024454 A1 | 1/2008 | Everest |
| 2008/0030482 A1 | 2/2008 | Elwell et al. |
| 2008/0036743 A1 | 2/2008 | Westerman et al. |
| 2008/0088600 A1 | 4/2008 | Prest et al. |
| 2008/0094367 A1 | 4/2008 | Van De Ven et al. |
| 2008/0105470 A1 | 5/2008 | Van De Ven et al. |
| 2008/0106523 A1 | 5/2008 | Conrad |
| 2008/0174852 A1 | 7/2008 | Hirai et al. |
| 2008/0180402 A1 | 7/2008 | Yoo et al. |
| 2008/0180405 A1 | 7/2008 | Han et al. |
| 2008/0180406 A1 | 7/2008 | Han et al. |
| 2008/0202249 A1 | 8/2008 | Yokura et al. |
| 2008/0204427 A1 | 8/2008 | Heesemans et al. |
| 2008/0211766 A1 | 9/2008 | Westerman et al. |
| 2008/0238446 A1 | 10/2008 | DeNatale et al. |
| 2008/0238884 A1 | 10/2008 | Harish |
| 2008/0259046 A1 | 10/2008 | Carsanaro |
| 2008/0284742 A1 | 11/2008 | Prest et al. |
| 2008/0303799 A1 | 12/2008 | Schwesig et al. |
| 2009/0027352 A1 | 1/2009 | Abele |
| 2009/0027353 A1 | 1/2009 | Im et al. |
| 2009/0046110 A1 | 2/2009 | Sadler et al. |
| 2009/0102805 A1 | 4/2009 | Meijer et al. |
| 2009/0140985 A1 | 6/2009 | Liu |
| 2009/0184921 A1 | 7/2009 | Scott et al. |
| 2009/0184936 A1 | 7/2009 | Algreatly |
| 2009/0213066 A1 | 8/2009 | Hardacker et al. |
| 2009/0237374 A1 | 9/2009 | Li et al. |
| 2009/0242282 A1 | 10/2009 | Kim et al. |
| 2009/0243817 A1 | 10/2009 | Son |
| 2009/0243998 A1 | 10/2009 | Wang |
| 2009/0256807 A1 | 10/2009 | Nurmi |
| 2009/0256817 A1 | 10/2009 | Perlin et al. |
| 2009/0282930 A1 | 11/2009 | Cheng et al. |
| 2009/0303400 A1 | 12/2009 | Hou et al. |
| 2009/0309852 A1 | 12/2009 | Lin et al. |
| 2009/0314551 A1 | 12/2009 | Nakajima |
| 2010/0013785 A1 | 1/2010 | Murai et al. |
| 2010/0020030 A1 | 1/2010 | Kim et al. |
| 2010/0020039 A1 | 1/2010 | Ricks et al. |
| 2010/0039396 A1 | 2/2010 | Ho et al. |
| 2010/0053087 A1 | 3/2010 | Dai et al. |
| 2010/0053116 A1 | 3/2010 | Daverman et al. |
| 2010/0066686 A1 | 3/2010 | Joguet et al. |
| 2010/0066697 A1 | 3/2010 | Jacomet et al. |
| 2010/0079391 A1 | 4/2010 | Joung |
| 2010/0079395 A1 | 4/2010 | Kim et al. |
| 2010/0079398 A1 | 4/2010 | Shen et al. |
| 2010/0097347 A1 | 4/2010 | Lin |
| 2010/0117978 A1 | 5/2010 | Shirado |
| 2010/0123671 A1 | 5/2010 | Lee |
| 2010/0123686 A1 | 5/2010 | Klinghult et al. |
| 2010/0127140 A1 | 5/2010 | Smith |
| 2010/0128002 A1 | 5/2010 | Stacy et al. |
| 2010/0153891 A1 | 6/2010 | Vaananen et al. |
| 2010/0164959 A1 | 7/2010 | Brown et al. |
| 2010/0220065 A1 | 9/2010 | Ma |
| 2010/0271325 A1 | 10/2010 | Conte et al. |
| 2010/0289807 A1 | 11/2010 | Yu et al. |
| 2010/0295807 A1 | 11/2010 | Xie et al. |
| 2010/0308844 A1 | 12/2010 | Day et al. |
| 2010/0315373 A1 | 12/2010 | Steinhauser et al. |
| 2010/0321310 A1 | 12/2010 | Kim et al. |
| 2010/0321319 A1 | 12/2010 | Hefti et al. |
| 2010/0323467 A1 | 12/2010 | Vaganov |
| 2010/0328229 A1 | 12/2010 | Weber et al. |
| 2010/0328230 A1 | 12/2010 | Faubert et al. |
| 2011/0001723 A1 | 1/2011 | Fan |
| 2011/0006980 A1 | 1/2011 | Taniguchi et al. |
| 2011/0007008 A1 | 1/2011 | Algreatly |
| 2011/0012848 A1 | 1/2011 | Li et al. |
| 2011/0018820 A1 | 1/2011 | Huitema et al. |
| 2011/0032211 A1 | 2/2011 | Christoffersen |
| 2011/0039602 A1 | 2/2011 | McNamara et al. |
| 2011/0050628 A1 | 3/2011 | Homma et al. |
| 2011/0050630 A1 | 3/2011 | Ikeda |
| 2011/0057899 A1 | 3/2011 | Sleeman et al. |
| 2011/0063248 A1 | 3/2011 | Yoon |
| 2011/0128250 A1 | 6/2011 | Murphy et al. |
| 2011/0141052 A1 | 6/2011 | Bernstein et al. |
| 2011/0141053 A1 | 6/2011 | Bulea et al. |
| 2011/0187674 A1 | 8/2011 | Baker et al. |
| 2011/0209555 A1 | 9/2011 | Ahles et al. |
| 2011/0227836 A1 | 9/2011 | Li et al. |
| 2011/0242014 A1 | 10/2011 | Tsai et al. |
| 2011/0267181 A1 | 11/2011 | Kildal |
| 2011/0267294 A1 | 11/2011 | Kildal |
| 2011/0273396 A1 | 11/2011 | Chung |
| 2011/0291951 A1 | 12/2011 | Tong |
| 2011/0298705 A1 | 12/2011 | Vaganov |
| 2012/0032907 A1 | 2/2012 | Koizumi et al. |
| 2012/0032915 A1 | 2/2012 | Wittorf |
| 2012/0038579 A1 | 2/2012 | Sasaki |
| 2012/0044169 A1 | 2/2012 | Enami |
| 2012/0044172 A1 | 2/2012 | Ohki et al. |
| 2012/0050159 A1 | 3/2012 | Yu et al. |
| 2012/0050208 A1 | 3/2012 | Dietz |
| 2012/0056837 A1 | 3/2012 | Park et al. |
| 2012/0062603 A1 | 3/2012 | Mizunuma et al. |
| 2012/0068946 A1 | 3/2012 | Tang et al. |
| 2012/0068969 A1 | 3/2012 | Bogana et al. |
| 2012/0081327 A1 | 4/2012 | Heubel et al. |
| 2012/0086659 A1 | 4/2012 | Perlin et al. |
| 2012/0092250 A1 | 4/2012 | Hadas et al. |
| 2012/0092279 A1 | 4/2012 | Martin |
| 2012/0092294 A1 | 4/2012 | Ganapathi et al. |
| 2012/0092299 A1 | 4/2012 | Harada et al. |
| 2012/0092324 A1 | 4/2012 | Buchan et al. |
| 2012/0105358 A1 | 5/2012 | Momeyer et al. |
| 2012/0105367 A1 | 5/2012 | Son et al. |
| 2012/0113061 A1 | 5/2012 | Ikeda |
| 2012/0127088 A1 | 5/2012 | Pance et al. |
| 2012/0127107 A1 | 5/2012 | Miyashita et al. |
| 2012/0139864 A1 | 6/2012 | Sleeman et al. |
| 2012/0146945 A1 | 6/2012 | Miyazawa et al. |
| 2012/0146946 A1 | 6/2012 | Wang et al. |
| 2012/0147052 A1 | 6/2012 | Homma et al. |
| 2012/0154315 A1 | 6/2012 | Aono |
| 2012/0154316 A1 | 6/2012 | Kono |
| 2012/0154317 A1 | 6/2012 | Aono |
| 2012/0154318 A1 | 6/2012 | Aono |
| 2012/0154328 A1 | 6/2012 | Kono |
| 2012/0154329 A1 | 6/2012 | Shinozaki |
| 2012/0154330 A1 | 6/2012 | Shimizu |
| 2012/0162122 A1 | 6/2012 | Geaghan |
| 2012/0169609 A1 | 7/2012 | Britton |
| 2012/0169617 A1 | 7/2012 | Mäenpää |
| 2012/0169635 A1 | 7/2012 | Liu |
| 2012/0169636 A1 | 7/2012 | Liu |
| 2012/0188181 A1 | 7/2012 | Ha et al. |
| 2012/0194460 A1 | 8/2012 | Kuwabara et al. |
| 2012/0194466 A1 | 8/2012 | Posamentier |
| 2012/0200526 A1 | 8/2012 | Lackey |
| 2012/0204653 A1 | 8/2012 | August et al. |
| 2012/0205165 A1 | 8/2012 | Strittmatter et al. |
| 2012/0218212 A1 | 8/2012 | Yu et al. |

(56) References Cited

U.S. PATENT DOCUMENTS

| | | |
|---|---|---|
| 2012/0319987 A1 | 12/2012 | Woo |
| 2012/0327025 A1 | 12/2012 | Huska et al. |
| 2013/0038541 A1 | 2/2013 | Bakker |
| 2013/0093685 A1 | 4/2013 | Kalu et al. |
| 2013/0239700 A1* | 9/2013 | Benfield et al. .......... 73/862.044 |
| 2014/0028575 A1 | 1/2014 | Parivar et al. |
| 2014/0055407 A1 | 2/2014 | Lee et al. |

OTHER PUBLICATIONS

International Search Report and Written Opinion, dated Nov. 14, 2013, in connection with corresponding International Application No. PCT/US2013/049288.

Nesterov et al., Modelling and investigation of the silicon twin design 3D micro probe, Institute of Physics Publishing, Journal of Micromechanics and Microengineering, 15, pp. 514-520 (2005).

* cited by examiner

MICROELECTROMECHANICAL LOAD SENSOR AND METHODS OF MANUFACTURING THE SAME

CROSS-REFERENCE TO RELATED APPLICATION

This application claims the benefit of U.S. Provisional Patent Application No. 61/668,135, filed on Jul. 5, 2012, entitled "Microelectromechanical Load Sensor and Methods of Using Same," the disclosure of which is expressly incorporated herein by reference in its entirety.

TECHNICAL FIELD

This disclosure relates to the technical field of touch interfaces based on microelectromechanical ("MEMS") load sensors that are used as input devices for data processing systems.

BACKGROUND

A variety of known MEMS devices are designed to measure applied load and produce an output differential voltage signal proportional to the applied load. These known devices, such as conventional piezoresistive, piezoelectric, and capacitive MEMS force sensors, pressure sensors, and strain gauges, utilize the unique electromechanical properties of materials such as silicon and lead zirconate titanate.

However, there is a need in the pertinent art for an interface device that is capable of receiving and recognizing a range of human user actions. There is also a need in the pertinent art for an interface device that is capable of tolerating a force from a user without being damaged or causing injury to the user.

SUMMARY

Described herein are MEMS load sensor devices and, more specifically, MEMS load sensor devices designed to measure an applied load and produce an output signal. More specifically, the MEMS load sensor devices described herein are configured to measure forces originating from human user actions such as pressing a button or a touch surface. The MEMS load sensor devices can be configured as a component of a force sensitive touch interface for providing touch input into a data processing system, for example. The MEMS load sensor devices can include a substrate, a deformable membrane, a load sensor element configured to produce a signal when deformed, an overload protection portion, and a means to communicate load sensor signals to an electrical circuit.

An example MEMS load sensor device can include a substrate defining a deformable membrane, a mesa and an overload protection portion. The mesa can be configured to receive and transfer an applied force to the deformable membrane, and the deformable membrane can be configured to deform in response to the applied force. The MEMS load sensor device can also include at least one load sensor element formed on the deformable membrane. The load sensor element can be configured to change at least one electrical characteristic based on an amount or magnitude of the applied force. Additionally, a height of the mesa can be greater than a height of the overload protection portion.

Optionally, the mesa defines a contact surface for receiving the applied force. The contact surface can have at least one of a substantially square, rectangular, rounded, circular or elliptical shape.

Alternatively or additionally, the mesa can optionally be arranged in a central portion of the substrate. Alternatively or additionally, the overload protection portion can optionally be arranged in a peripheral portion of the substrate.

Optionally, the MEMS load sensor device can further include a touch surface fixed to at least a portion of the mesa. The touch surface can be configured to receive and transfer the applied force to the mesa. Additionally, a gap can be arranged between the touch surface and the overload protection portion when the touch surface is fixed to the mesa. The gap can limit an amount of deflection of the deformable membrane and can prevent the deformable membrane from mechanically failing under an excessive applied force.

Alternatively or additionally, the MEMS load sensor device can optionally include one or more electromechanical connectors for connecting the MEMS load sensor device to an external circuit.

Optionally, the deformable membrane, the mesa and the overload protection portion can be formed by removing a portion of the substrate. For example, the substrate can have a first surface and a second surface opposite to the first surface. The deformable membrane, the mesa and the overload protection portion can be formed using a deep reactive ion etching technique on the second surface. Additionally, the MEMS load sensor device can optionally include one or more electromechanical connectors for connecting the MEMS load sensor device to an external circuit formed on the first surface.

Optionally, the load sensor element can be a piezoresistive element. Additionally, the MEMS load sensor device can include a plurality of piezoresistive elements electrically connected in a Wheatstone bridge circuit. Additionally, the MEMS load sensor device can optionally include an activation circuit for supplying a voltage to the Wheatstone bridge circuit and for communicating a differential output voltage from the Wheatstone bridge circuit. For example, the activation circuit can include one or more output signal traces for communicating the differential output voltage from the Wheatstone bridge circuit to a signal bus and one or more voltage supply traces for connecting the Wheatstone bridge circuit to an external voltage source. The MEMS load sensor device can also include a row trace and a column trace for addressing the MEMS load sensor device and a logical gate having an input and output and one or more switches connected to the output of the logical gate. The input of the logical gate can be connected to the row and column traces, and each switch can be configured to electrically connect an output trace and the signal bus or a voltage supply trace and the external voltage source.

Also described herein is a method of manufacturing a MEMS load sensor device and optionally electrically and mechanically attaching the MEMS load sensor device to a separate circuit substrate. For example, the method includes the steps to manufacture the MEMS load sensor device and also optionally includes the steps to attach the MEMS load sensor device to the separate circuit substrate. The steps include micromachining the mechanical elements such as the deformable membrane, mesa, and overload protection portion, forming (e.g., by ion implantation) a load sensor element such as a piezoresistive element, metallization steps to form traces to connect the piezoresistive element to other electrical circuit elements on the MEMS load sensor device, steps to embed complementary metal-oxide-semiconductor ("CMOS") circuitry to activate the MEMS load sensor device and to connect the MEMS load sensor device output to a signal bus of a separate circuit, steps to add electrical and mechanical connectors, and post processing steps to electrically and mechanically attach the MEMS load sensor device to a separate circuit substrate.

An example method for manufacturing a MEMS load sensor device can include providing a substrate having a first surface and a second surface opposite to the first surface, forming at least one load sensor element on the first surface of the substrate and etching the second surface of the substrate to form a deformable membrane, a mesa and an overload protection portion. The mesa can be configured to receive and transfer an applied force to the deformable membrane, and the deformable membrane can be configured to deform in response to the applied force. Additionally, the load sensor element can be provided on the deformable membrane and can be configured to change at least one electrical characteristic based on an amount or magnitude of the applied force. A height of the mesa can be greater than a height of the overload protection portion.

Optionally, in the method above, etching the second surface of the substrate to form a deformable membrane, a mesa and an overload protection portion can further include applying a layer of photoresist over the second surface of the substrate, irradiating a portion of the layer of photoresist with ultraviolet light through a mask and removing the irradiated portion of the layer of photoresist to expose a portion of the second surface of the substrate. Thereafter, the method can further include etching the exposed portion of the second surface of the substrate to form the deformable membrane, the mesa and the overload protection portion. For example, the second surface of the substrate can be etched using a deep ion etching technique.

Alternatively or additionally, in the method above, forming at least one load sensor element on the first surface of the substrate can further include applying a layer of silicon oxide over the first surface of the substrate, applying a layer of photoresist over the layer of silicon oxide, irradiating a portion of the layer of photoresist with ultraviolet light through a mask and removing the irradiated portion of the layer of photoresist to expose a portion of the layer of silicon oxide. Thereafter, the method can further include etching the exposed portion of the layer of silicon oxide to expose a portion of the first layer of the substrate and forming the load sensor element on the exposed portion of the first layer of the substrate.

Optionally, the load sensor element can be a piezoresistive element formed using a deposition, diffusion, or ion implantation technique.

Alternatively or additionally, the method can optionally include forming at least one electrical trace on the first surface of the substrate. The electrical trace can be electrically connected to the load sensor element.

Alternatively or additionally, the method can optionally further include forming one or more electromechanical connectors for connecting the MEMS load sensor device to an external circuit.

Optionally, the mesa defines a contact surface for receiving the applied force. The contact surface can have at least one of a substantially square, rectangular, rounded, circular or elliptical shape.

Alternatively or additionally, the mesa can optionally be arranged in a central portion of the substrate. Alternatively or additionally, the overload protection portion can optionally be arranged in a peripheral portion of the substrate.

Optionally, the method can further include fixing a touch surface to at least a portion of the mesa. The touch surface can be configured to receive and transfer the applied force to the mesa. Additionally, a gap can be arranged between the touch surface and the overload protection portion when the touch surface is fixed to the mesa. The gap can limit an amount of deflection of the deformable membrane and can prevent the deformable membrane from mechanically failing under an excessive applied force.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The components in the drawings are not necessarily to scale relative to each other. Like reference numerals designate corresponding parts throughout the several views.

DETAILED DESCRIPTION

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. While implementations will be described with respect to a MEMS load sensor device and method of manufacturing the same, it will become evident to those skilled in the art that the implementations are not limited thereto.

Figure 1:
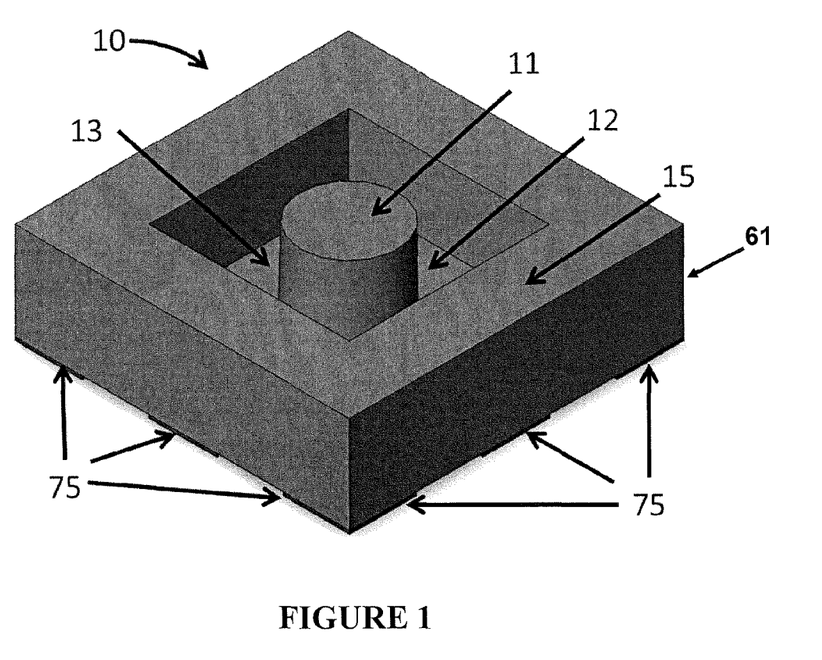
FIG. 1 is an isometric view of an example load sensor device.
Figure 2:
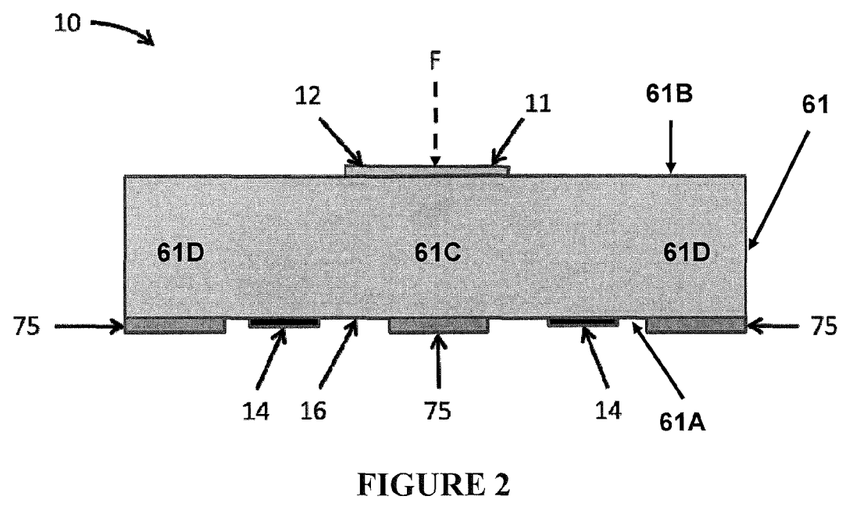
FIG. 2 is a side view of the load sensor device of FIG. 1.

Described herein is an example MEMS load sensor device (e.g., load sensor device) for measuring a force applied to a least a portion thereof. In one aspect, as depicted in FIGS. 1-6, the load sensor device 10 includes a substrate 61 defining a deformable membrane 13, a mesa 12 and an overload protection portion 15. It should be understood that the overload protection portion as used herein can include a range of structures such as a ring, for example. The substrate 61 can optionally be a silicon substrate. As shown in FIGS. 1 and 2, the substrate 61 can have a first surface 61A and a second surface 61B opposite the first surface 61A, and the mesa 12 and the overload protection portion 15 can optionally be arranged in a central portion 61C and a peripheral portion 61D of the substrate 61, respectively. As discussed in more detail below, the deformable membrane 13, the mesa 12 and the overload protection portion 15 can be formed from the substrate 61 using an etching process. Additionally, at least one load sensor element (e.g., piezoresistive elements 14 and 82 discussed below) can be formed on the deformable membrane 13. Optionally the load sensor element can be a piezoresistive, piezoelectric or capacitive element. The load sensor element can be configured to change at least one electrical characteristic (e.g., resistance, charge, capacitance, etc.) based on an amount or magnitude of the applied force. Optionally, the load sensor element can output a signal proportional to the amount or magnitude of the applied force.

Figure 3:
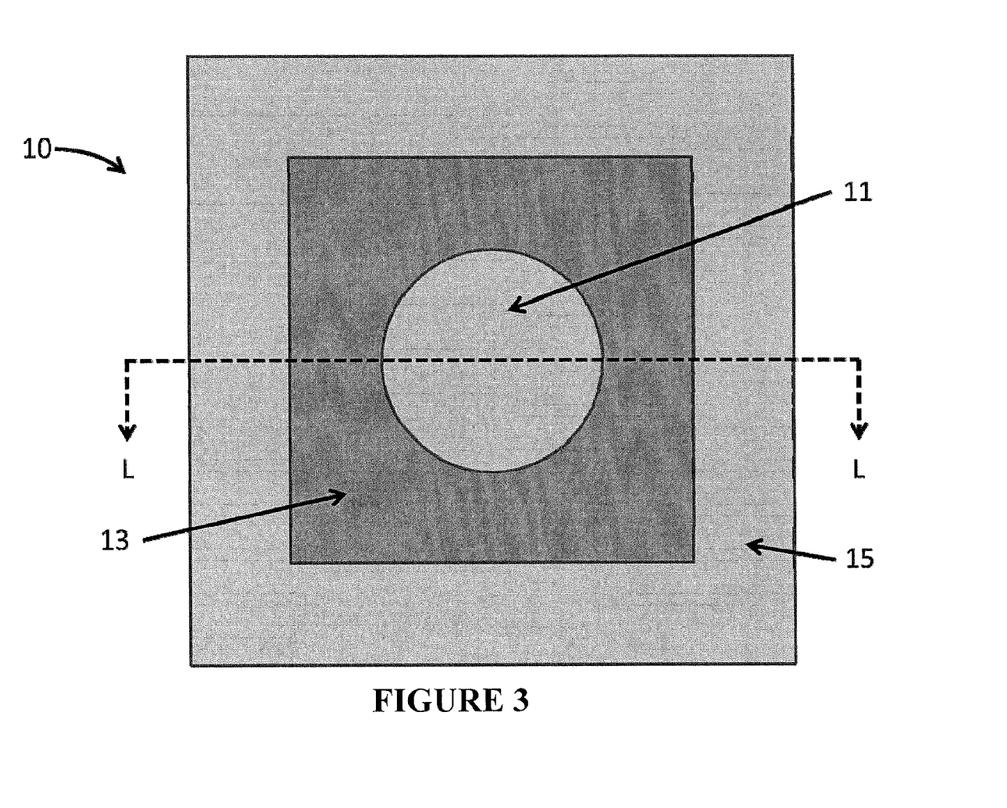
FIG. 3 is a top view of the load sensor device of FIG. 1.
Figure 4:
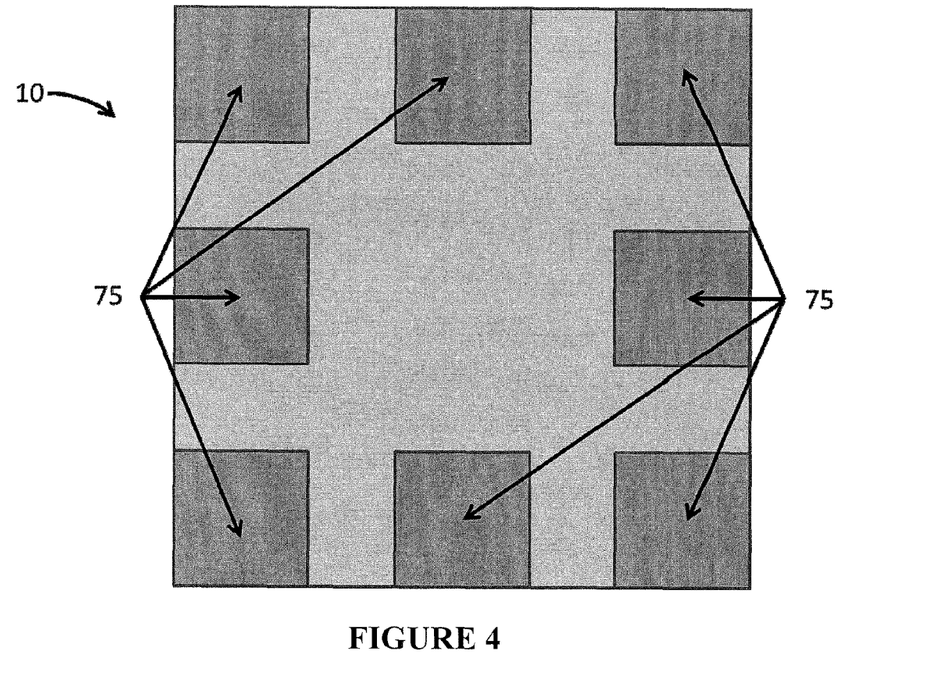
FIG. 4 is a bottom view of the load sensor device of FIG. 1.
Figure 5:
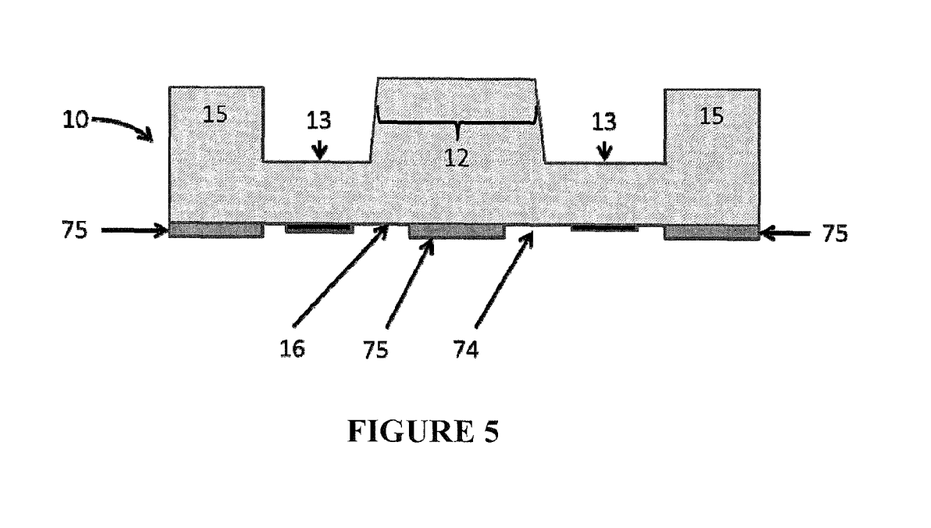
FIG. 5 is a cross sectional view of the load sensor device of FIG. 1 along the line L of FIG. 3.
Figure 6:
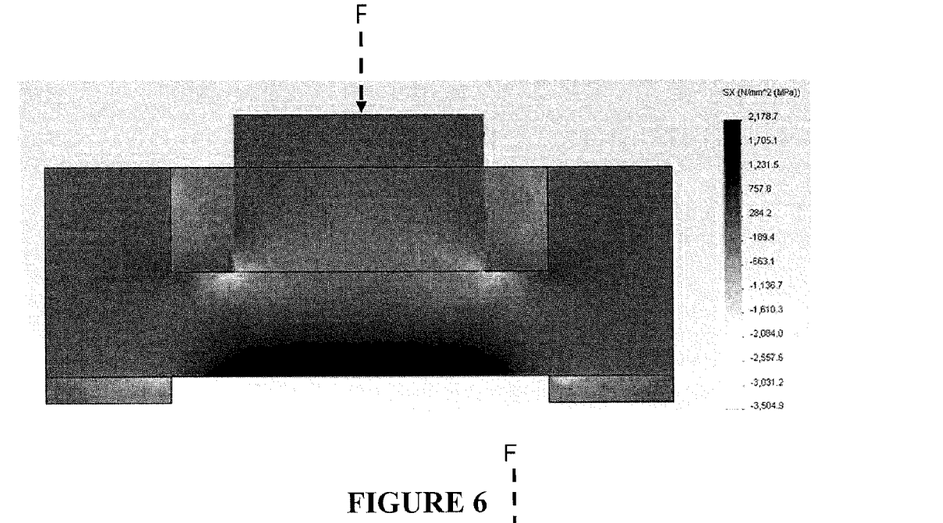
FIG. 6 is a cross sectional view of the load sensor device along the line L of FIG. 3, with a force F applied showing concentration of stresses within the device.
Figure 7:
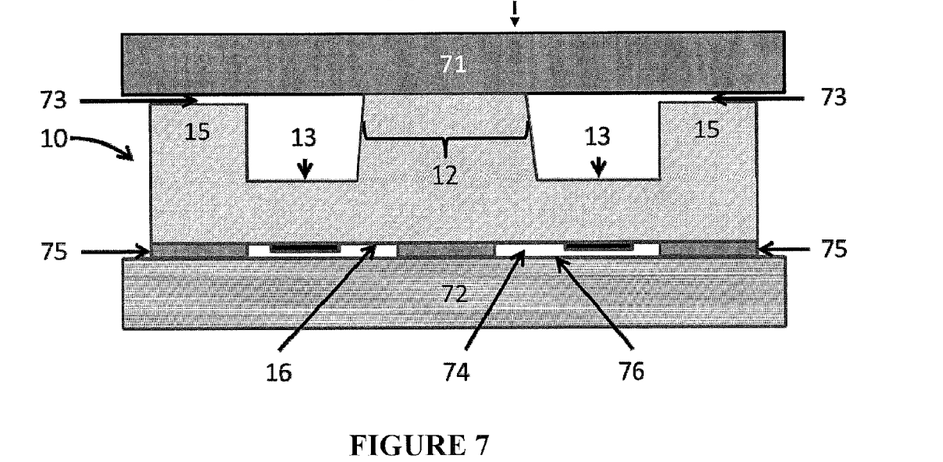
FIG. 7 is a cross sectional view of the load sensor device of FIG. 1 when electrically and mechanically connected to a circuit substrate and a touch surface.

Additionally, the mesa 12 can define a contact surface 11, for example along the top surface of the mesa 12, for receiving an applied force F and transmitting the force F to the deformable membrane 13. It is contemplated that the contact surface 11 can have any shape, such as, for example and without limitation, a substantially square shape, a substantially round, circular or elliptical shape as depicted in FIGS. 1-3, a substantially rectangular shape, and the like. Additionally, this disclosure contemplates that the contact surface 11 can have shapes other than those described herein, and therefore, this disclosure should not be limited to the shapes described herein and/or shown in the figures. It is further contemplated, with reference to FIG. 3, that the contact surface 11 can be affixed below a touch surface 71 in order to receive the reaction force F transmitted through the touch surface 71 as depicted in FIG. 7. For example, as discussed below, at least a portion of the contact surface 11 can be bonded to at least a portion of the touch surface 71 using an adhesive. As the deformable membrane 13 deforms, a strain gradient forms within the substrate 61. The concentration of stresses in the load sensor device 10 in response to the applied force F is illustrated in FIG. 6. The strain gradient imparts a localized strain on the piezoresistive elements 14 and 82 (e.g., the load sensor elements). As the piezoresistive elements 14 and 82 experience strain, their respective resistivities change, such that a Wheatstone bridge circuit, e.g., the Wheatstone bridge circuit 81 of FIG. 8, including two piezoresistive elements 14 and two oppositely arranged piezoresistive elements 82 (or stationary resistors) becomes unbalanced and produce a differential voltage across the positive signal terminal 83 and the negative signal terminal 84. This differential voltage is directly proportional to the applied force F on the contact surface 11. In addition, the load sensor device 10 can include one or more electromechanical connectors 75 for electrically and mechanically connecting the load sensor device 10 to a separate circuit substrate.

As discussed above, the load sensor device 10 can include a touch surface (e.g., touch surface 71), for example, fixed to the contact surface 11 of the mesa 12. In an additional aspect, the load sensor device 10 incorporates an upper air gap 73 between the overload protection portion 15 and the touch surface 71. As shown in FIG. 7, the upper air gap 73 exists because the height of the mesa 12 is greater than the height of the overload protection portion 15. The difference in height between the mesa 12 and the overload protection portion 15 can be selected or engineered to be less than the maximum vertical deflection of the deformable membrane 13 before it yields or fails due to an excessive applied force. As the force F is applied to the touch surface 71, the deformable membrane 13 deforms, and when the force F reaches a threshold, the touch surface 71 comes into contact with the overload protection portion 15. At this point, the deformable membrane 13 no longer deforms linearly with applied force F. In this way the upper air gap 73 and the overload protection portion 15 work together to prevent the load sensor device 10 (e.g., the deformable membrane 13) from mechanically failing under excessive applied force F.

Alternatively or additionally, the load sensor device 10 optionally incorporates a lower air gap 74 between a lower surface 16 of the load sensor device 10 and an upper surface of a separate circuit substrate 72 as shown in FIG. 7. As the force F is applied to the touch surface 71, the deformable membrane 13 deforms, allowing the touch surface 71 to move closer to and, as the force F becomes sufficiently large, come in contact with the overload protection portion 15. Alternatively or additionally, as the force F becomes sufficiently larger and the deformable membrane 13 deforms lower, the lower surface 16 of the load sensor device 10 comes into contact with an upper surface 76 of the separate circuit substrate 72. Once force F reaches an upper threshold and the touch surface 71 is in contact with the overload protection portion 15 and the lower surface 16 of the load sensor device 10 comes into contact with the upper surface 76 of the separate circuit substrate 72, the deformable membrane 13 no longer deforms linearly with applied force F. In this way the upper air gap 73, the lower air gap 74, and the overload protection portion 15 work together to prevent the load sensor device 10 (e.g., the deformable membrane 13) from mechanically failing under excessive applied force F. Electromechanical connectors 75, such as a solder joints or wire bonds, can be provided. The electromechanical connectors 75 are used to electrically and mechanically connect the load sensor device 10 to the separate circuit substrate 72.

Figure 8:
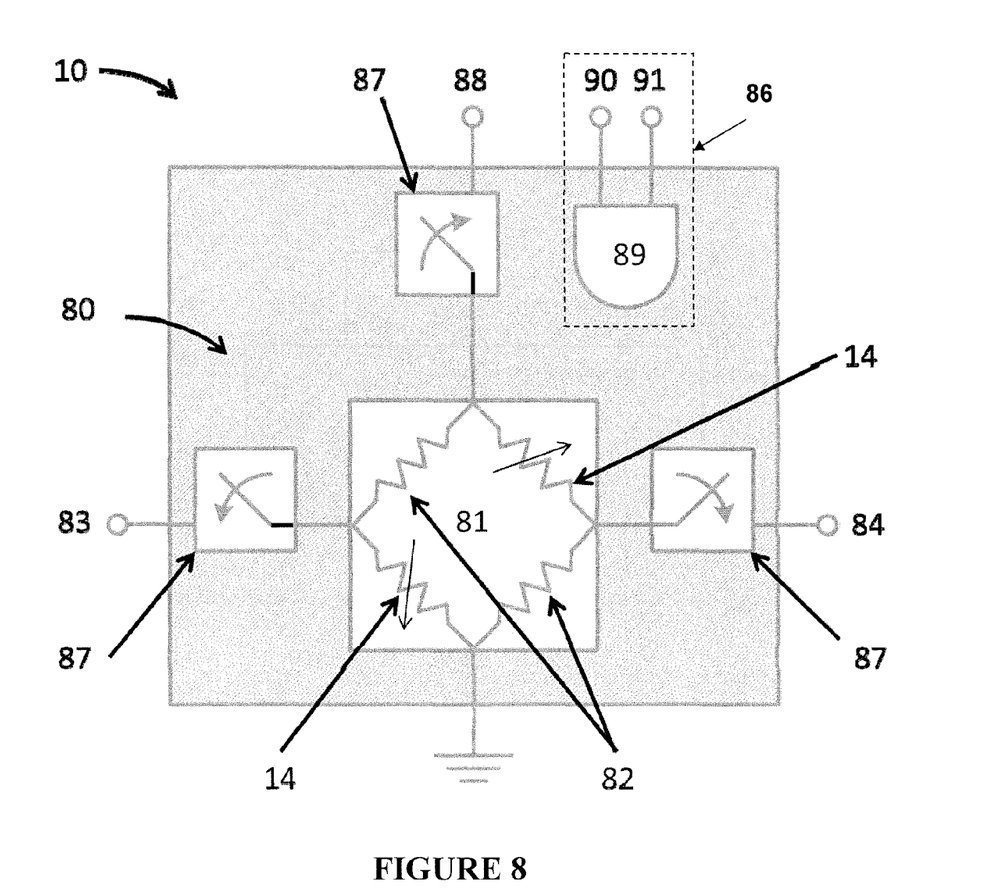
FIG. 8 is an electrical schematic diagram of the electrical circuits embedded within the load sensor device of FIG. 1.
Figure 9:
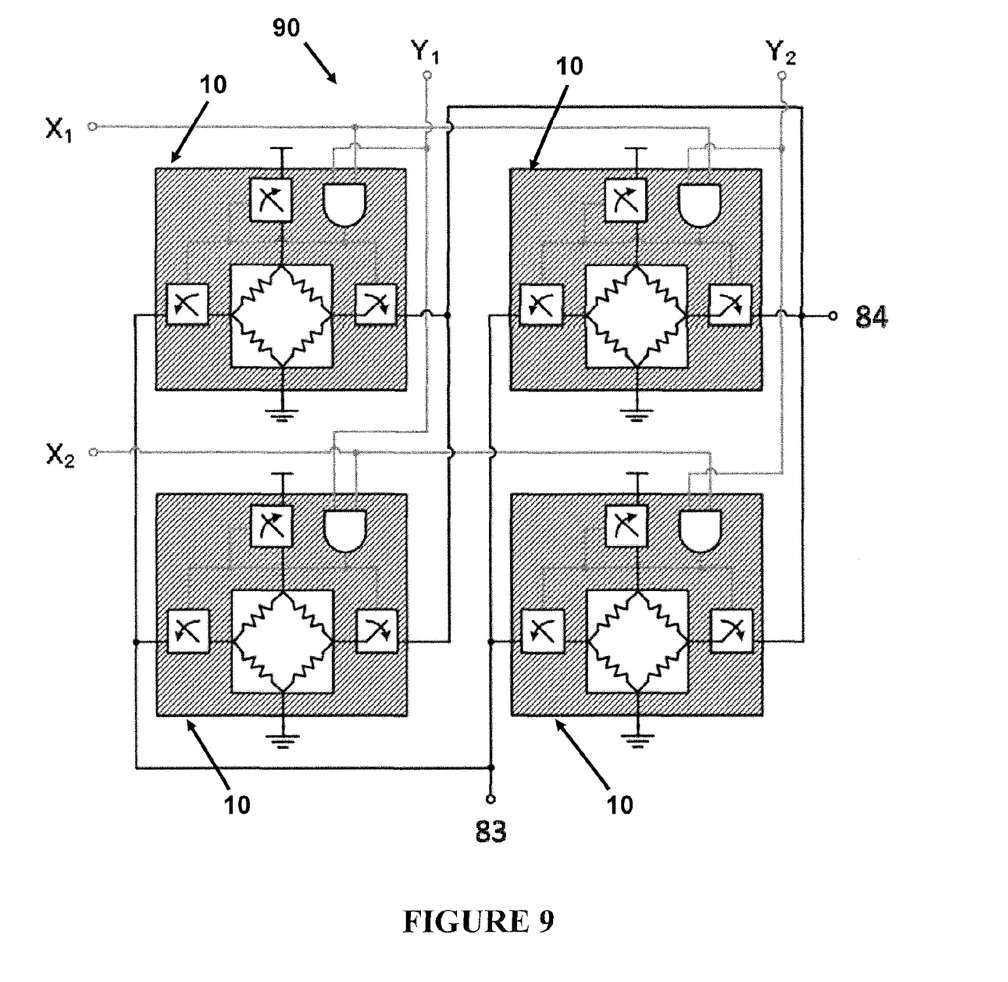
FIG. 9 is an electrical schematic diagram of multiple load sensor devices of FIG. 1 in an independently addressable array.

Referring now to FIG. 8, in an additional aspect, the load sensor device 10 includes and/or incorporates electrical circuitry 80 to activate the load sensor device 10 and electrically connect the load sensor device 10 to a separate circuit signal bus, for example, through electromechanical connectors such as electromechanical connectors 75 of FIGS. 2, 4, 5 and 7. Optionally, the electromechanical connectors are solder joints or wire bonds. As discussed above, the electrical circuitry 80 can include the Wheatstone bridge circuit 81. In one embodiment, the electrical circuitry 80 includes of an activation circuit 86 including an X row signal trace 90 and a Y column signal trace 91 and a logical gate (e.g., AND gate 89). The row and column signal traces 90 and 91 can be used to individually address the load sensor device 10. For example, when both X and Y signals are logic high, the AND gate 89 is enabled, which closes a plurality of switches 87. The electrical circuitry 80 can also include one or more voltage supply traces for electrically connecting the Wheatstone bridge circuit 81 to an external voltage source 88 and one or more output signal traces for electrically connecting the positive and negative terminals 83 and 84 to the separate circuit signal bus. Each of the switches, respectively, connects the external voltage source 88 to the Wheatstone bridge circuit 81 or connects the positive signal terminal 83 and the negative signal terminal 84, respectively, to the separate circuit signal bus. In this way, an array of load sensor devices 10 can be placed into an independently addressable array 90, wherein the sensor value of each individual load sensor device 10 can be read independently, for example, by a microcontroller. An independently addressable array 90 including a plurality of load sensor device 10 is depicted in FIG. 9.

Figure 10:
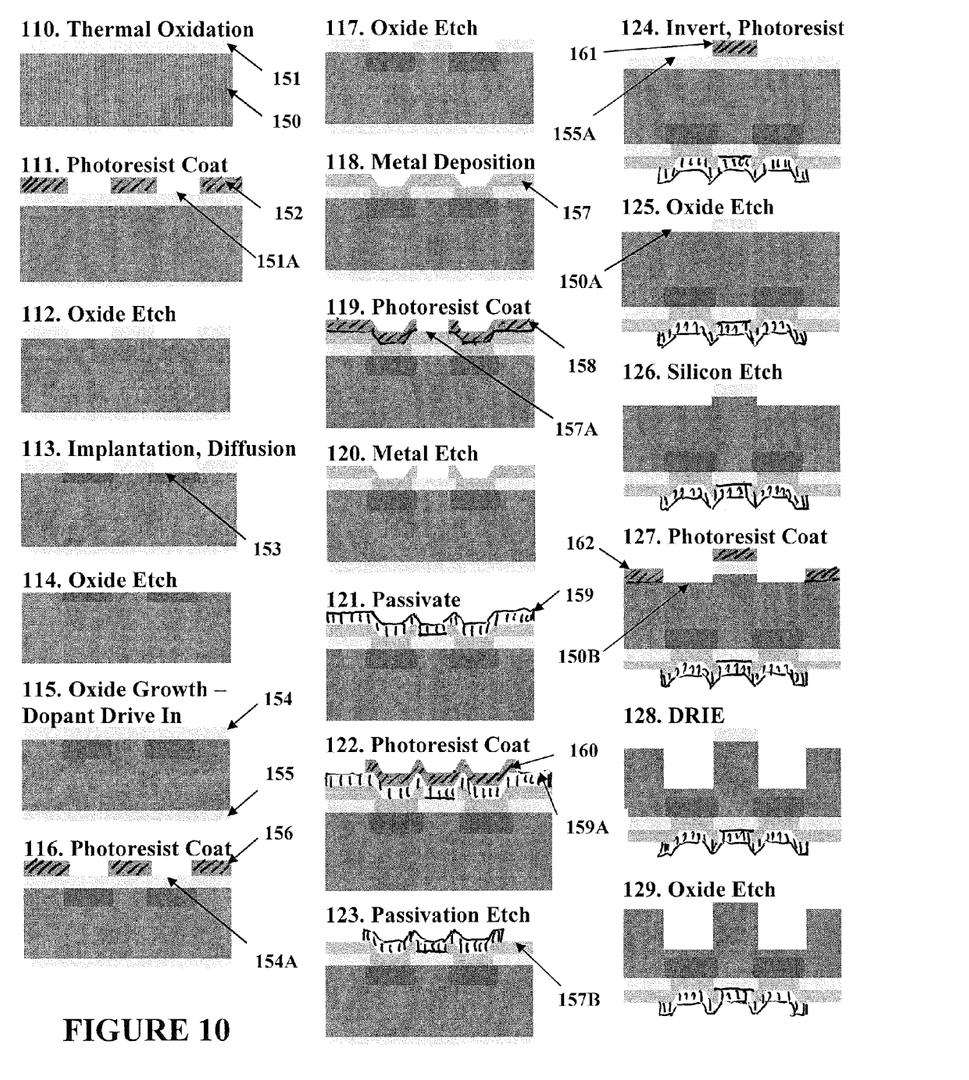
FIG. 10 illustrates the process steps to manufacture the load sensor device of FIG. 1.

Referring now to FIG. 10, a method for manufacturing a MEMS load sensor device such as the load sensor device 10 discussed above is described herein. In the described method, step 110 involves growing or depositing a layer of silicon oxide 151 onto a surface of a bare silicon wafer 150. Optionally, the layer of silicon oxide is grown or deposited on a surface of a silicon wafer on which electrical circuitry (e.g., the electrical circuitry 80 discussed above) for activating the load sensor device is already embedded through a separate CMOS semiconductor fabrication process. It should be understood that the silicon wafer can have an upper surface (or a first surface as used herein) and a lower surface (or a second surface as used herein) opposite to the upper surface. The surface of the silicon wafer on which the layer of silicon oxide is grown or deposited in step 110 can be the upper surface of the silicon wafer. In step 111, a layer of photoresist 152 is applied or deposited onto at least a portion of the upper surface of the silicon wafer, for example, over the layer of silicon oxide. Thereafter, ultraviolet light is cast through a mask to weaken portions of the layer of photoresist. The layer of photoresist is then developed and at least a portion of the layer of silicon oxide 151A is exposed, such that the exposed portion can be removed with an etchant as in step 112. In step 113, one or more piezoresistive elements 153 (e.g., load sensors elements) are formed, for example, by a deposition, diffusion or ion implantation process. The piezoresistive elements 153 can be the piezoresistive elements 14 and 82 discussed above, for example.

In step 114, the layer of silicon oxide 151 is etched completely. In step 115, the silicon wafer is annealed and an additional layer of silicon oxide 154 is formed, for example, on the upper surface of the silicon wafer over the piezoresistive elements 153. Additionally, a layer of silicon oxide 155 is also formed over on the opposite surface of the silicon wafer. It should be understood that the opposite surface of the silicon wafer as used herein can be the lower surface of the silicon wafer. In step 116, an additional layer of photoresist 156 is applied onto at least a portion of the upper surface of the silicon wafer, for example, over the layer of silicon oxide 154. Thereafter, ultraviolet light is cast through a mask, which weakens portions of the layer of photoresist 156. The layer of photoresist is then developed in order to expose at least a portion of the layer of silicon oxide 154A covering the piezoresistive elements 153. In step 117, the exposed portion of the layer of silicon oxide is etched completely to expose the piezoresistive elements 153, e.g., an upper portion of the piezoresistive elements 153. In step 118, a conductive metal 157 (e.g., an electrical trace), such as aluminum, is sputtered onto the upper surface of the silicon wafer, for example, over the exposed piezoresistive elements, to form electrical connections between the piezoresistive elements 153 and the electromechanical connectors (discussed below). In step 119, an additional layer of photoresist 158 is applied onto at least a portion of the upper surface of the silicon wafer, for example, over the conductive metal. Thereafter, ultraviolet light is cast through a mask, which weakens at least a portion of the layer of photoresist. The layer of photoresist is then developed in order to expose at least a portion of the conductive metal 157A to be removed. In step 120, the exposed portion of the conductive metal is etched completely to leave the remaining conductive metal forming one or more portions of the connecting circuitry (e.g., one or more portions of the electrical circuitry 80 discussed above).

In step 121, a passivation layer 159 is deposited or applied to protect the piezoresistive elements 153 and conductive metal 157. In step 122, an additional layer of photoresist 160 is applied to the upper surface of the silicon wafer, for example, over the passivation layer. Thereafter, ultraviolet light is cast through a mask to weaken at least a portion of the layer of photoresist. The layer of photoresist is then developed in order to expose at least a portion of the passivation layer 159A to be removed. In step 123, the exposed portion of the passivation layer is etched completely to leave a portion of the conductive metal 157B underneath exposed for electrical contact.

In step 124, the silicon wafer is inverted to expose the lower surface of the silicon wafer. As discussed above with regard to step 115, the lower surface of the silicon wafer has the layer of silicon oxide 155 formed thereon. In addition, an additional layer of photoresist 161 is applied to the lower surface of the silicon wafer, for example, over a portion of the layer of silicon oxide. Thereafter, ultraviolet light is cast through a mask to weaken at least a portion of the layer of photoresist. The layer of photoresist is then developed in order to expose at least a portion of the layer of silicon oxide 155A formed over the lower surface of the silicon wafer. In step 125, the exposed portion of the layer of silicon oxide is etched completely to expose a portion of the lower surface of the silicon wafer 150A. In step 126, the exposed portion of silicon wafer is etched to form the height offset between a mesa and overload protection portion (e.g., the mesa 12 and overload protection portion 15 discussed above) to provide overload protection. In step 127, an additional layer of photoresist 162 is applied onto at least a portion of the lower surface of the silicon wafer. Thereafter, ultraviolet light is cast through a mask to weaken at least a portion of the layer of photoresist. The layer of photoresist is then developed in order to expose at least a portion of the lower surface of the silicon wafer 150B. In step 128, the silicon on the lower surface of the silicon wafer is etched away using a deep reactive ion etching process to form an integrated mesa, contact surface, deformable membrane and overload protection portion (e.g., the mesa 12, contact surface 11, deformable membrane 13 and overload protection portion 15). In step 129, the layer of silicon oxide on the upper surface of the mesa is etched completely to leave exposed bare silicon. The silicon wafer can then optionally be inverted and electromechanical connectors (e.g., electromechanical connectors 75 discussed above) such as solder bumps, wire bonds, etc. are attached to the load sensor device, e.g., to the same surface of the bare silicon wafer on which the piezoresistive elements were formed. The load sensor device is then ready for a separate manufacturing process to be attached to an electrical circuit.

Figure 11:
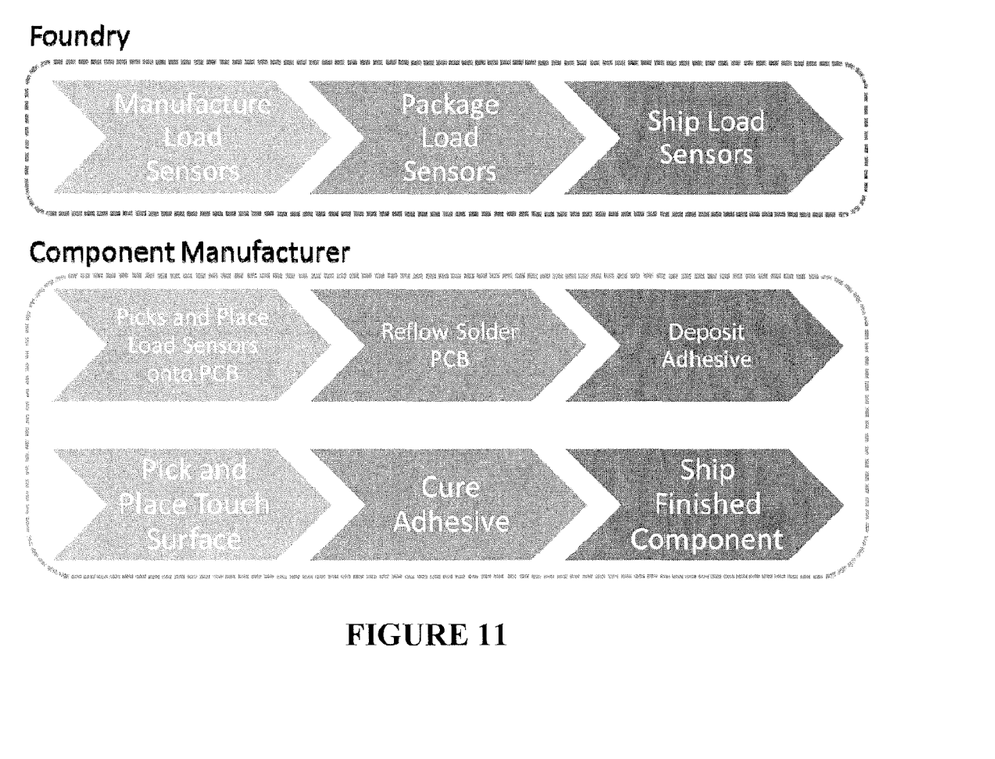
FIG. 11 illustrates the process steps to electrically and mechanically attach the load sensor device of FIG. 1 to a separate circuit.

Referring now to FIG. 11, the steps to attach a load sensor device (e.g., load sensor device 10 of FIGS. 1-7) to a separate circuit substrate (e.g., separate circuit substrate 72 of FIG. 7) and complete a touch solution are illustrated. In this final manufacturing process, the load sensor devices are first bonded to the substrate, such as FR4, of a separate circuit. Then, the electrical and mechanical connections are formed through a process such as reflow soldering or wire bonding. Finally, a touch surface (e.g., touch surface 71 of FIG. 7) is affixed to each load sensor device (e.g., to the contact surface 11 of the mesa 12 of each load sensor 10 of FIGS. 1-7) in the finished component using adhesive, and the entire assembly is cured to form a finished touch surface component.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A microelectromechanical (MEMS) load sensor device, comprising:
    a substrate defining a deformable membrane, a mesa and an overload protection portion, the mesa being configured to receive and transfer an applied force to the deformable membrane, the deformable membrane being configured to deform in response to the applied force; and
    at least one load sensor element formed on the deformable membrane, the load sensor element being configured to change at least one electrical characteristic based on an amount or magnitude of the applied force, wherein a height of the mesa is greater than a height of the overload protection portion.

2. The MEMS load sensor device of claim 1, wherein the mesa defines a contact surface for receiving the applied force.

3. The MEMS load sensor device of 2, wherein the contact surface has at least one of a substantially square, rectangular, rounded, circular or elliptical shape.

4. The MEMS load sensor device of any of claim 1, wherein the mesa is arranged in a central portion of the substrate.

5. The MEMS load sensor device of claim 1, wherein the overload protection portion is arranged in a peripheral portion of the substrate.

6. The MEMS load sensor device of claim 1, further comprising a touch surface fixed to at least a portion of the mesa, wherein the touch surface is configured to receive and transfer the applied force to the mesa.

7. The MEMS load sensor device of claim 6, wherein a gap is arranged between the touch surface and the overload protection portion when the touch surface is fixed to the mesa, the gap limiting an amount of deflection of the deformable membrane and preventing the deformable membrane from mechanically failing under an excessive applied force.

8. The MEMS load sensor device of claim 1, further comprising one or more electromechanical connectors for connecting the MEMS load sensor device to an external circuit.

9. The MEMS load sensor device of claim 1, wherein the deformable membrane, the mesa and the overload protection portion are formed by removing a portion of the substrate.

10. The MEMS load sensor device of claim 9, wherein the substrate has a first surface and a second surface opposite to the first surface, and the deformable membrane, the mesa and the overload protection portion are formed using a deep reactive ion etching technique on the second surface.

11. The MEMS load sensor device of claim 10, wherein one or more electromechanical connectors for connecting the MEMS load sensor device to an external circuit are formed on the first surface.

12. The MEMS load sensor device of claim 1, wherein the load sensor element comprises a piezoresistive element.

13. The MEMS load sensor device of claim 12, further comprising a plurality of piezoresistive elements electrically connected in a Wheatstone bridge circuit.

14. The MEMS load sensor device of claim 13, further comprising an activation circuit for supplying a voltage to the Wheatstone bridge circuit and for communicating a differential output voltage from the Wheatstone bridge circuit.

15. The MEMS load sensor device of claim 14, wherein the activation circuit comprises:
    one or more output signal traces for communicating the differential output voltage from the Wheatstone bridge circuit to a signal bus;
    one or more voltage supply traces for connecting the Wheatstone bridge circuit to an external voltage source;
    a row trace and a column trace for addressing the MEMS load sensor device;
    a logical gate having an input and output, the input of the logical gate being connected to the row and column traces; and
    one or more switches connected to the output of the logical gate, wherein each switch is configured to electrically connect an output trace and the signal bus or a voltage supply trace and the external voltage source.

16. A method for manufacturing a microelectromechanical (MEMS) load sensor device, comprising:
    providing a substrate having a first surface and a second surface opposite to the first surface;
    forming at least one load sensor element on the first surface of the substrate; and
    etching the second surface of the substrate to form a deformable membrane, a mesa and an overload protection portion, the mesa being configured to receive and transfer an applied force to the deformable membrane, the deformable membrane being configured to deform in response to the applied force, and the load sensor element being provided on the deformable membrane and being configured to change at least one electrical characteristic based on an amount or magnitude of the applied force, wherein a height of the mesa is greater than a height of the overload protection portion.

17. The method of claim 16, wherein etching the second surface of the substrate to form a deformable membrane, a mesa and an overload protection portion further comprises:
    applying a layer of photoresist over the second surface of the substrate;
    irradiating a portion of the layer of photoresist with ultraviolet light through a mask;
    removing the irradiated portion of the layer of photoresist to expose a portion of the second surface of the substrate; and
    etching the exposed portion of the second surface of the substrate to form the deformable membrane, the mesa and the overload protection portion.

18. The method of claim 16, wherein forming at least one load sensor element on the first surface of the substrate further comprises:
    applying a layer of silicon oxide over the first surface of the substrate;
    applying a layer of photoresist over the layer of silicon oxide;
    irradiating a portion of the layer of photoresist with ultraviolet light through a mask;
    removing the irradiated portion of the layer of photoresist to expose a portion of the layer of silicon oxide;
    etching the exposed portion of the layer of silicon oxide to expose a portion of the first layer of the substrate; and
    forming the load sensor element on the exposed portion of the first layer of the substrate.

19. The method of claim 18, wherein the load sensor element is a piezoresistive element formed using an ion implantation technique.

20. The method of claim 16, further comprising fixing a touch surface to at least a portion of the mesa, wherein the touch surface is configured to receive and transfer the applied force to the mesa, wherein a gap is arranged between the touch surface and the overload protection portion when the touch surface is fixed to the mesa, the gap limiting an amount of deflection of the deformable membrane and preventing the deformable membrane from mechanically failing under an excessive applied force.

\* \* \* \* \*